(12) United States Patent
Yajima (10) Patent No.: US 7,402,494 B2
(45) Date of Patent: Jul. 22, 2008

(54) METHOD FOR FABRICATING HIGH VOLTAGE SEMICONDUCTOR DEVICE

(75) Inventor: Tsukasa Yajima, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 30 days.

(21) Appl. No.: 11/641,909

(22) Filed: Dec. 20, 2006

(65) Prior Publication Data

US 2007/0232001 A1  Oct. 4, 2007

(30) Foreign Application Priority Data

Mar. 30, 2006  (JP) .............................. 2006-093754

(51) Int. Cl.
*H01L 21/8234* (2006.01)
*H01L 21/336* (2006.01)
*H01L 21/332* (2006.01)

(52) U.S. Cl. ................ 438/275; 438/285; 438/221; 438/133; 438/305; 438/170; 257/341; 257/E21.443; 257/E21.444

(58) Field of Classification Search ................ 438/275, 438/285, 221, 170, 305, 133; 257/341, E21.443, 257/E21.444
See application file for complete search history.

(56) References Cited

U.S. PATENT DOCUMENTS 5,422,286 A * 6/1995 Yang .......................... 438/133

FOREIGN PATENT DOCUMENTS

JP  2003-100771  4/2003

* cited by examiner

*Primary Examiner*—Michael S. Lebentritt
*Assistant Examiner*—Mohsen Ahmadi
(74) *Attorney, Agent, or Firm*—Rabin & Berdo, PC (57) ABSTRACT

A method for fabricating a high voltage semiconductor device, which comprises a semiconductor substrate; a gate insulation layer formed on the semiconductor substrate; and a gate electrode formed on the gate insulation layer, comprising: forming a mask pattern on the semiconductor substrate; forming a first low-density impurity implanted region on the semiconductor substrate using the mask pattern, in which the first low-density impurity implanted region is overlapped with the gate electrode; selectively removing a part of the mask pattern from a region where the gate electrode is to be formed to form a gate-formation mask; and forming the gate insulating layer and the gate electrode using the gate-formation mask.

11 Claims, 7 Drawing Sheets

METHOD FOR FABRICATING HIGH VOLTAGE SEMICONDUCTOR DEVICE

CROSS REFERENCE TO RELATED APPLICATION

This application claims the priority of Application No. 2006-93754, filed on Mar. 30, 2006 in Japan, the subject matter of which is incorporated herein by reference.

TECHNICAL FIELD OF THE INVENTION

The present invention relates to a method for fabricating a high voltage semiconductor device. In particular, the present invention relates to a high voltage MOS (Metal Oxide Semiconductor) transistor having a gate-overlap LDD (Lightly Doped Drain) structure.

BACKGROUND OF THE INVENTION

In order to improve the degree of integration of a semiconductor integrated circuit, a channel length of a MOS transistor would be shortened. If a channel length of a MOS transistor is shortened, a hot-carrier implantation phenomenon would become remarkable, and therefore, a threshold voltage of the MOS transistor would be fluctuated. For suppressing generation of hot carriers, electrical filed around a drain region is decreased. A LDD structure, which includes a region having a lower density of impurities as compared to a drain region, has been used.

According to a LDD structure, a drain has a double-region structure including a first region with a lower density of impurity and a second region with a higher density of impurity, so that a depletion layer of the drain is extended not only to the channel region but also to the first region having a lower density of impurity. As a result, electric field near the drain region is reduced and weakened.

Japanese patent publication No. 2003-100771A describes a high voltage MOS transistor having a gate-overlap LDD (Lightly Doped Drain) structure, in which a gate electrode and a low density diffusion layer are overlapped.

FIGS. 1-1 to 1-9 illustrate fabrications steps of a high voltage MOS transistor according to a conventional technology. First, as shown in FIG. 1-1, element isolation regions 12 are formed in a p-type silicon substrate 10 by a STI process. Next, as shown in FIG. 1-2, a resist pattern 14 is formed on the silicon substrate 10 by a well-known photo-lithographic process.

Figure 11:
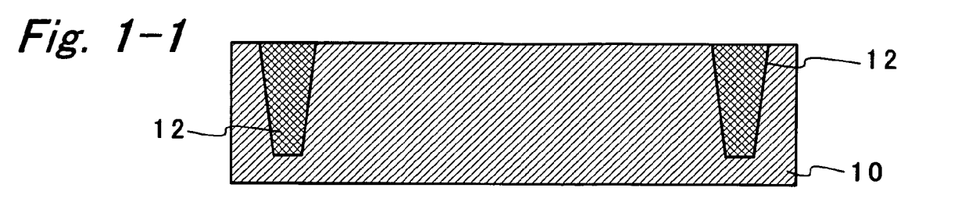
Figure 12:
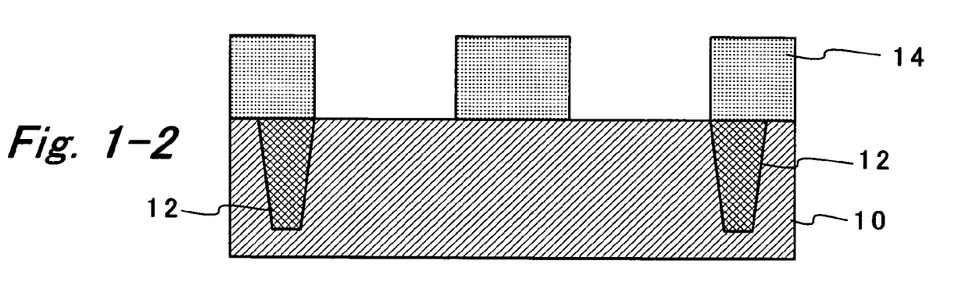
Figure 13:
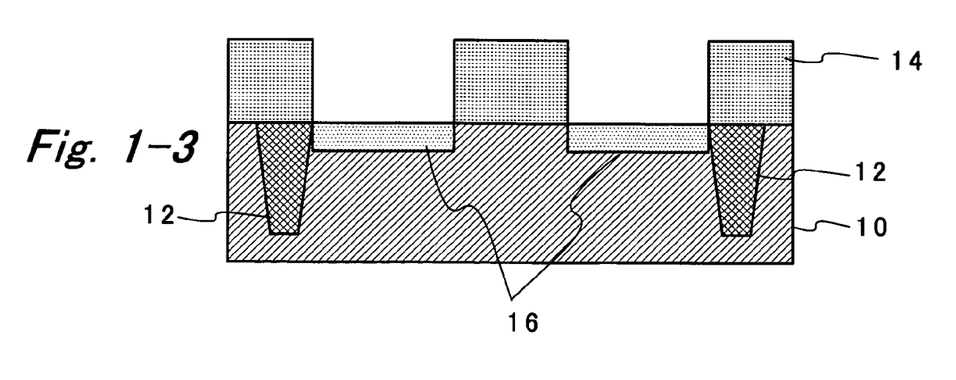
Figure 14:
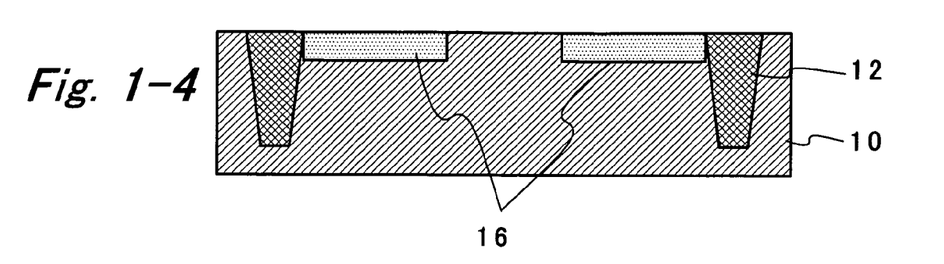
Figure 15:
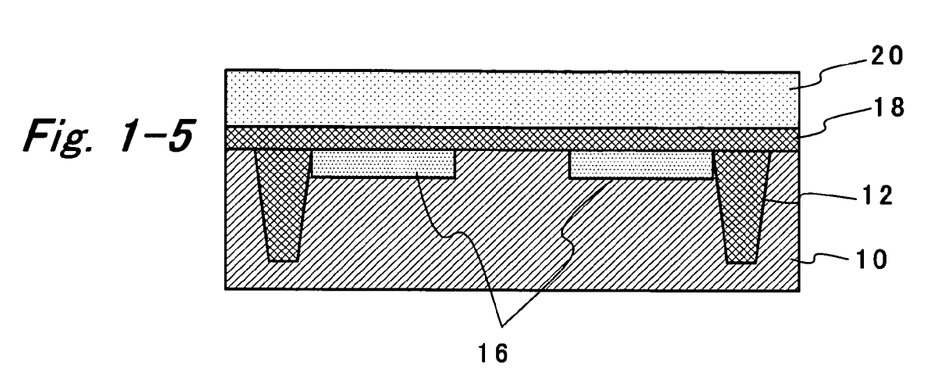

Next, as shown in FIG. 1-3, phosphorus is implanted as impurities in the silicon substrate 10 using the resist pattern 14 as a mask to form a pair of low-density impurity-implanted regions 16 of n-type. The low-density impurity-implanted regions 16 are formed by an ion implantation process at $1.0 \times 10^{13}$ cm$^{-2}$. Next, as shown in FIG. 1-4, the resist layer 14 is removed. Next, as shown in FIG. 1-5, a gate oxide layer 18 is formed on the silicon substrate 10 to have a thickness of 500 Å by a thermal oxidation process. After that, a poly-silicon layer 20 is formed on the gate oxide layer 18 to have a thickness of 3000 Å by a CVD process.

Figure 16:
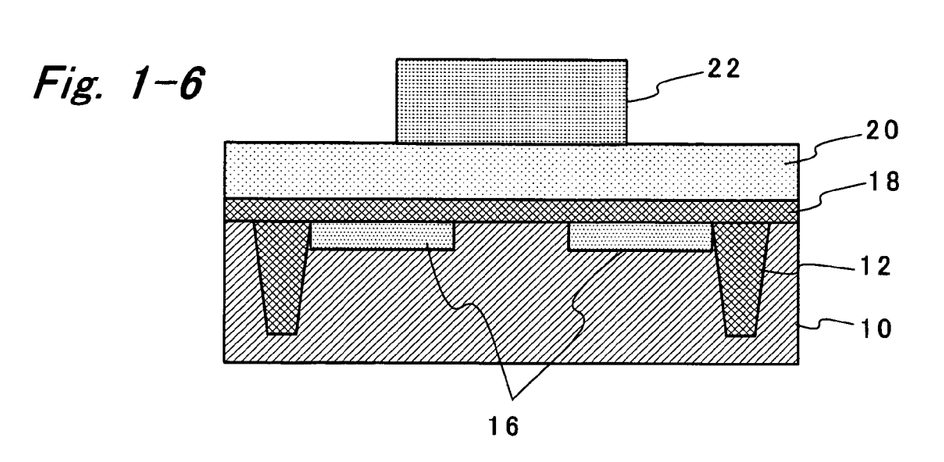
Figure 17:
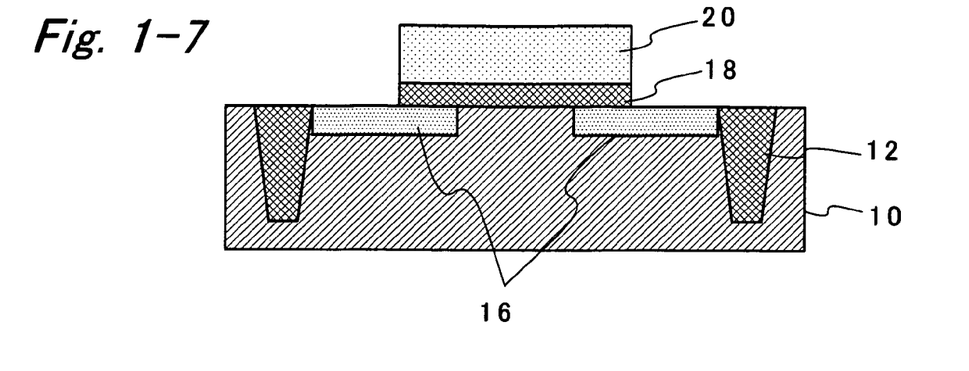

Next, as shown in FIG. 1-6, a resist pattern 22 is formed on the poly-silicon layer 20 by a well-know photolithographic process. After that, as shown in FIG. 1-7, the poly-silicon layer 20 and the gate oxide layer 18 are etched using the resist pattern 22 as an etching mask to form a gate electrode.

Figure 18:
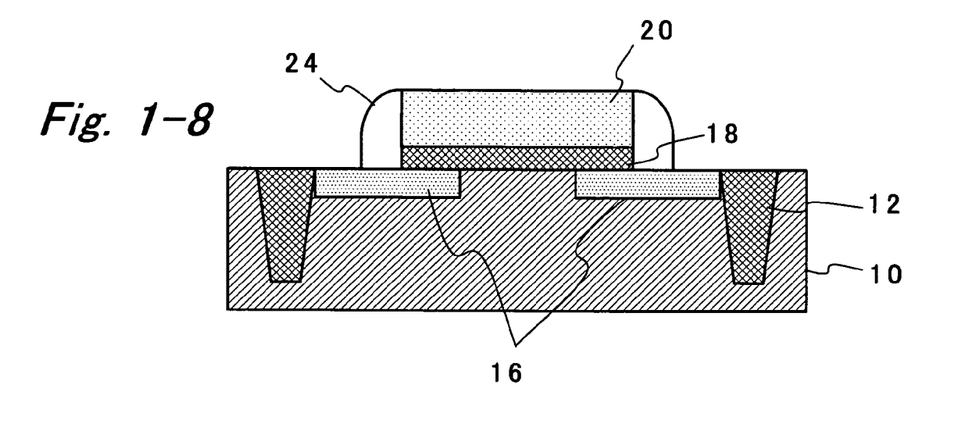

Next, an oxide layer is formed on the silicon substrate 10 to have a thickness of 5000 Å by a CVD process. After that, as shown in FIG. 1-8, the oxide layer is shaped to form a side wall 24 on a side surface of the gate electrode 20 and on a side surface of the gate oxide layer 18 by an etching back process.

Figure 19:
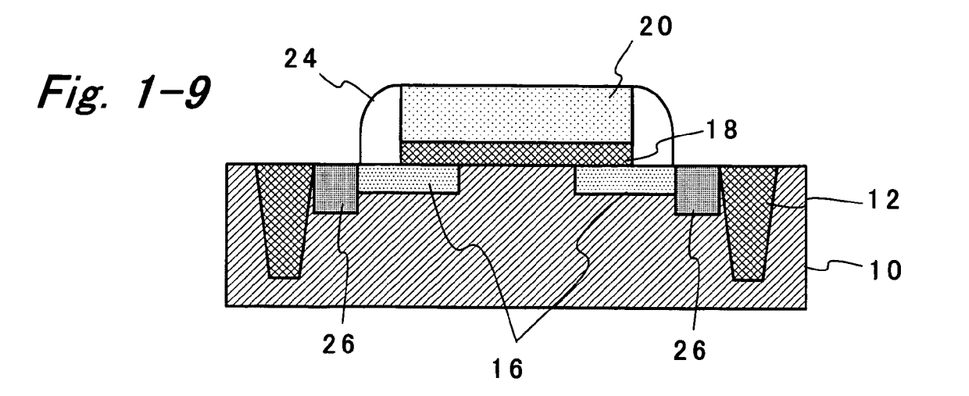

Next, arsenic of $1.0 \times 10^{13}$ cm$^{-2}$ is implanted into the silicon substrate 10 by a photolithographic process and an ion implantation process to form high-density impurity-implanted regions 26, as shown in FIG. 1-9. The high-density impurity-implanted regions 26 function as source and drain electrodes. After that, a thermal treatment is carried out so that impurities in the low-density impurity-implanted regions 16 are diffused to form low-density n-type impurity-diffused regions and impurities in the high-density impurity-implanted regions 26 are diffused to form high-density n-type impurity-diffused regions. According to the above described steps, a high voltage MOS transistor having a gate-overlap structure, is fabricated.

However, according to the above-described conventional technology, it is difficult to align a gate electrode and low-density n-type impurity-diffused regions directly to each other. If the gate electrode and the low-density n-type impurity-diffused regions are not located properly, the gate-overlap length between them would be fluctuated. As a result, characteristics of a MOS transistor would be fluctuated as well. A substrate current of a MOS transistor changes in accordance with the gate-overlap length. The more the gate-overlap length is shortened, the more the substrate current of a MOS transistor would be increased. In more detail, when the overlap length between the gate electrode and the low-density n-type impurity-diffused regions becomes lower than 0.5 μm, the substrate current of a MOS transistor would be rapidly increased. And therefore, a hot-carrier resistance of the MOS transistor would be remarkably decreased.

Japanese Patent Publication H05-243262A describes a method for controlling an overlap area between the gate electrode and the low-density n-type impurity-diffused regions by a self-alignment manner. According to a method described in Japanese Patent Publication H05-243262A, an etching mask having an opening is formed on a first gate electrode layer, then a second gate electrode layer is formed over the etching mask. Subsequently, the second gate electrode layer that is located on a side surface of the opening is selectively removed to form side openings. After that, impurities are implanted from the side openings into a semiconductor substrate to form low-density regions. Next, a coating layer is formed in the opening, and the first and second gate electrode layers are etched using the coating layer as a mask. Subsequently, high-density impurity regions are formed.

According to Japanese Patent Publication H05-243262A, the second gate electrode layer is etched before performing an ion implantation to form the low density impurity regions. When etching the second gate electrode layer, the dimension and shape of the side opening are defined by the difference of etching speed between a flat surface region and a side surface region. Therefore, the dimension of the side opening varies due to the thickness of the second gate electrode layer.

When the thickness of the second gate electrode layer varies, the dimension of the side openings varies as well, and therefore, the area or length of overlapped regions of the gate electrode and the low-density impurity-diffused regions varies. In another case, overlapped lengths vary in a single MOS transistor. Namely, according to the conventional technology, it is difficult to control an overlapped area or length of a gate electrode and low density impurity diffused regions precisely.

OBJECTS OF THE INVENTION

Accordingly, an object of the present invention is to provide a method for fabricating a high voltage semiconductor device, in which an overlapped area or length between a gate electrode and impurity diffused regions can be controlled precisely.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method for fabricating a high voltage semiconductor device, which comprises a semiconductor substrate; a gate insulation layer formed on the semiconductor substrate; and a gate electrode formed on the gate insulation layer, comprising: forming a mask pattern on the semiconductor substrate; forming a first low-density impurity implanted region on the semiconductor substrate using the mask pattern, in which the first low-density impurity implanted region is overlapped with the gate electrode; selectively removing a part of the mask pattern from a region where the gate electrode is to be formed to form a gate-formation mask; and forming the gate insulating layer and the gate electrode using the gate-formation mask.

According to a second aspect of the present invention, a method for fabricating a high voltage MOS transistor, which comprises a semiconductor substrate; a gate insulation layer formed on the semiconductor substrate; and a gate electrode formed on the gate insulation layer, comprising: forming a mask pattern on the semiconductor substrate; forming a first low-density impurity implanted region on the semiconductor substrate using the mask pattern, in which the first low-density impurity implanted region is overlapped with the gate electrode; selectively removing a part of the mask pattern from a region where the gate electrode is to be formed to form a gate-formation mask; forming the gate insulating layer and the gate electrode using the gate-formation mask; removing the gate-formation mask after the gate electrode is formed; forming a second low-density impurity implanted region on the semiconductor so that the second low-density impurity implanted region is located outside the first low-density impurity implanted region; and forming a high-density impurity implanted region after the second low-density impurity-implanted region is formed, the high-density impurity implanted region having a higher density of impurity than the first and second low-density impurity-implanted regions.

According to the present invention, a gate electrode is formed by using a part of a mask, which has been used for forming first low-density impurity regions, so that the gate electrode and the first low-density impurity regions can be aligned to each other in relative location precisely. In other words, the gate electrode can be formed in self-alignment manner relative to the low-density impurity regions. Therefore, an overlapped area or length between a gate electrode and impurity diffused regions can be controlled precisely. Characteristic fluctuation of a high voltage MOS transistor is prevented or remarkably reduced.

BRIEF DESCRIPTION OF THE DRAWINGS

FIGS. 1-1 to 1-9 are cross sectional views illustrating fabrication steps of a high voltage MOS transistor according to a conventional technology.

FIGS. 2-1 to 2-12 are cross sectional views illustrating fabrication steps of a high voltage MOS transistor according to an embodiment of the present invention.

DESCRIPTION OF THE REFERENCE NUMERALS

100: Silicon Substrate
102: Device Isolating Region
104: Oxide Layer
104A, 104B: LDD Oxide Layer
106: First Low-Density n-type Impurity Diffused Region
108: Resist Layer
110: Gate Insulation Layer
112: Gate Electrode (Poly-Silicon Layer)
116: Second Low-Density n-type Impurity Diffused Region
118: High-Density n-type Impurity Diffused Region
120: Side Wall

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 21:
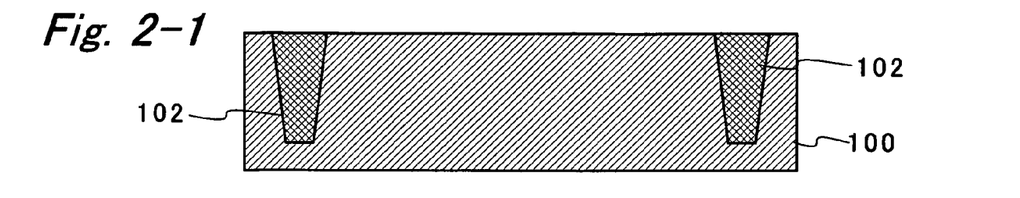

Now, a preferred embodiment of the present invention is described. First, as shown in FIG. 2-1, a pair of device isolating regions 102 is formed in a p-type silicon substrate 100 by a well-known STI (Shallow Trench Isolation) process.

Figure 22:
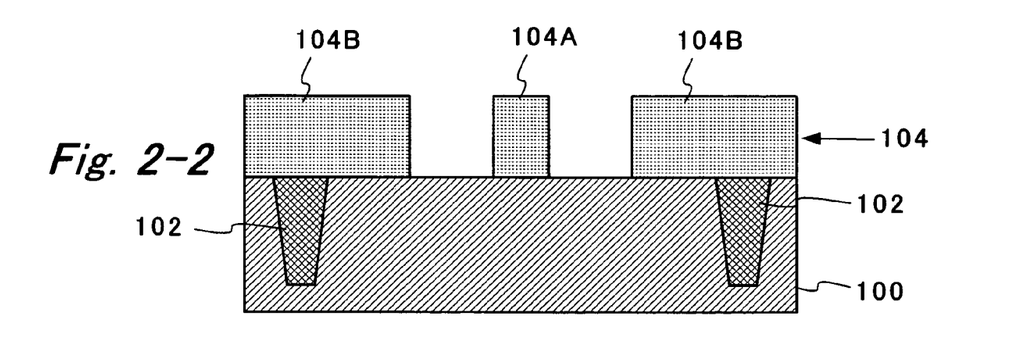

Next, an oxide layer 104 is formed on the p-type silicon substrate 100 to have a thickness of about 3000 Å, which correspond to a height of a gate electrode, by a well-known CVD process. The oxide layer 104, which is to be functioning as a mask, may be replaced by a nitride layer instead. After that, as shown in FIG. 2-2, the oxide layer 104 is selectively removed by a well-know photolithographic process and etching process to form oxide-layer patterns 104A and 104B. The oxide-layer patterns 104A and 104B form openings at areas where first low-density impurity-diffused regions are formed at.

Figure 23:
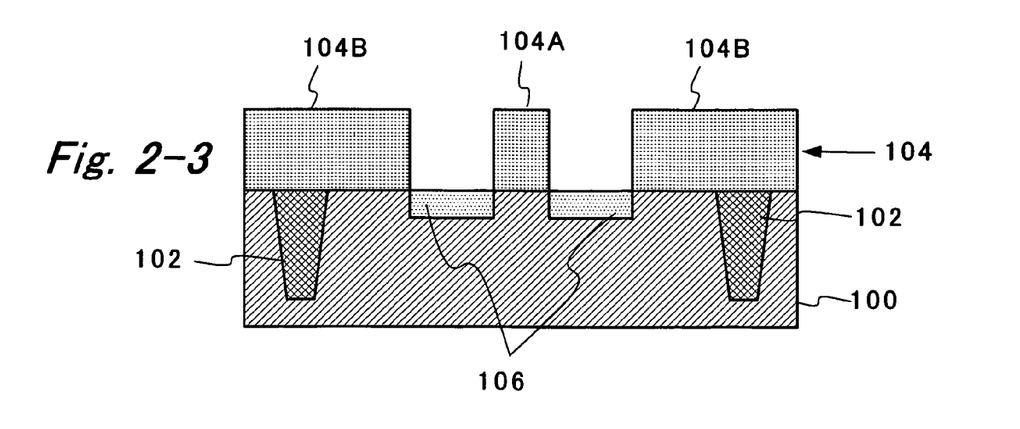

Next, about $1.0 \times 10^{13}$ cm$^{-2}$ of impurities, such as phosphorus, are implanted in the openings of the oxide layer using the oxide layer patterns 104A and 104B as a mask to form a pair of first low-density n-type impurity diffused regions 106 in the silicon substrate 100, as shown in FIG. 2-3. The first low-density n-type impurity diffused regions 106 have a conductive type of "n", which is the opposite of the silicon substrate 100.

Figure 24:
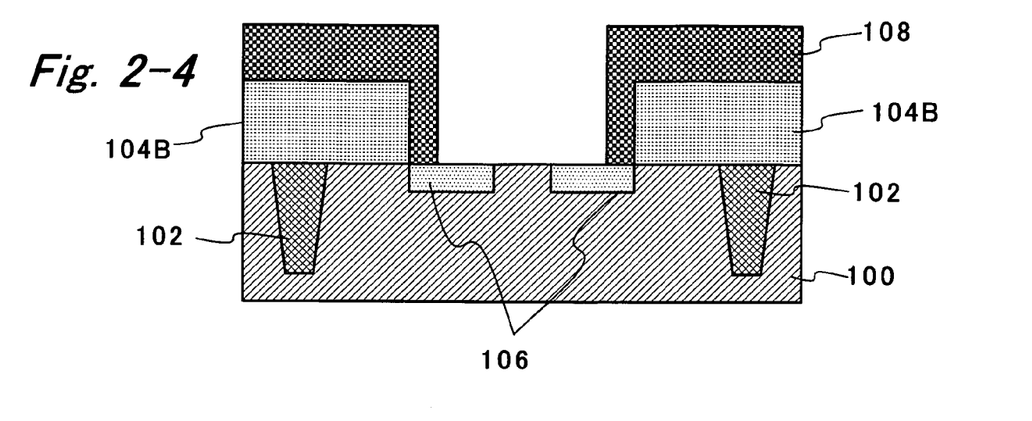

Next, a resist layer is formed over the substrate, shown in FIG. 2-3, entirely, and a well-known photolithography process is carried out to form the resist pattern 108. After that, the oxide layer pattern 104A, located on a channel region of the MOS transistor, is removed by an etching process, as shown in FIG. 2-4. The remaining oxide layer 104B is used for forming a gate electrode, and can be called "gate-formation mask". The channel region is located between the pair of low-density n-type impurity diffused regions 106. In the etching process to the oxide layer pattern 104A, the other oxide layer pattern 104B is covered with the resist pattern 108, so that the oxide layer pattern 104B are not removed but still existing on the p-type silicon substrate 100 and on the device isolation regions 102. Such an etching process may be of a wet-etching using hydrofluoric acid or of a dry-etching.

Figure 25:
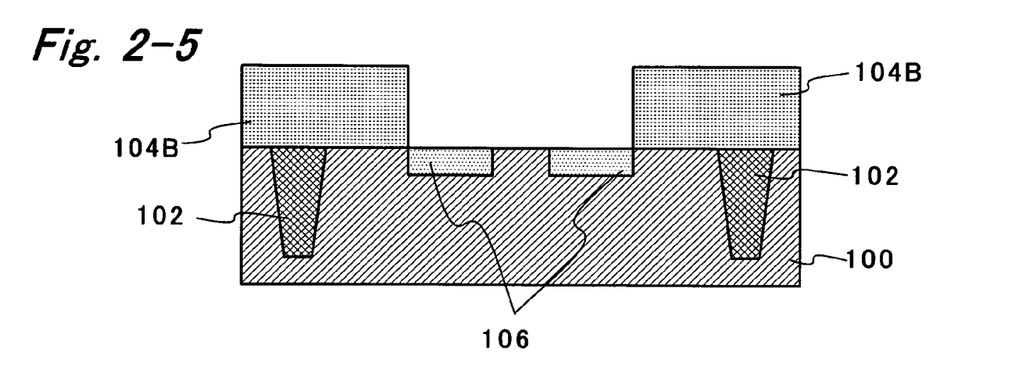

Subsequently, as shown in FIG. 2-5, the resist pattern 108 is removed.

Figure 26:
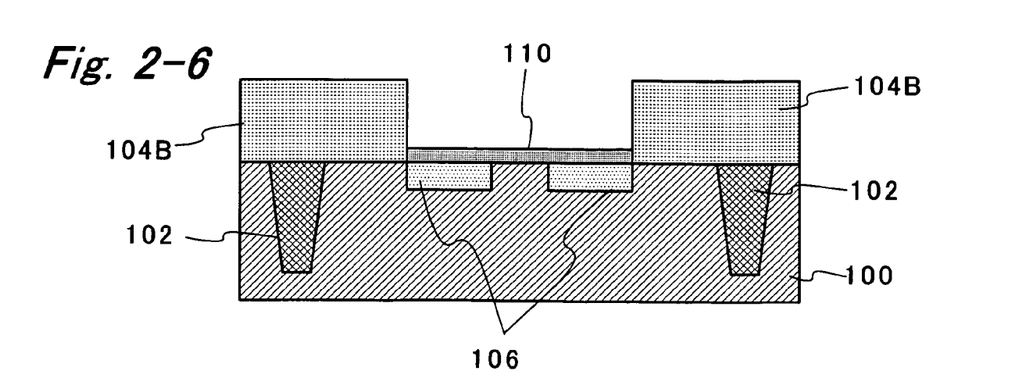

Next, a gate oxide layer 110 is formed in the area which is not covered with the oxide layer pattern 104B on the silicon substrate 100 by a well-known thermal oxidation process, as shown in FIG. 2-6. The gate oxide layer (gate insulation layer) 110 has a thickness of about 500 Å. In such a thermal oxidation process, the gate oxide layer 110 is formed using the oxide layer pattern 104B, which has been used for forming the low-density n-type impurity diffused regions 106, as a mask. Therefore, outer ends (edge) of the low-density n-type impurity diffused regions 106 and outer ends (edge) of the gate oxide layer 110 are well aligned to each other at a high accuracy.

Figure 27:
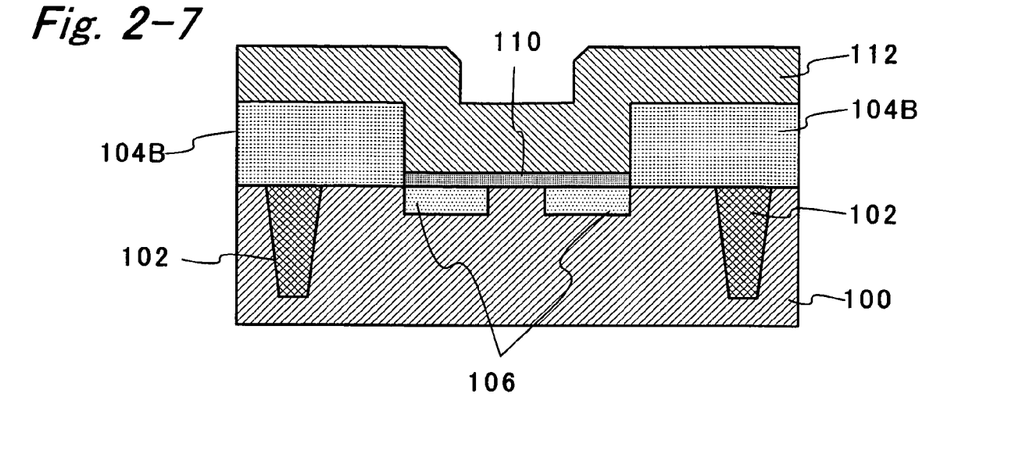

Next, a poly-silicon layer 112 is formed over the gate oxide layer 110 and the oxide layer pattern 104B, as shown in FIG. 2-7. The poly-silicon layer 112 is sufficiently filled in the channel opening, which is not covered with the oxide layer pattern 104B.

Figure 28:
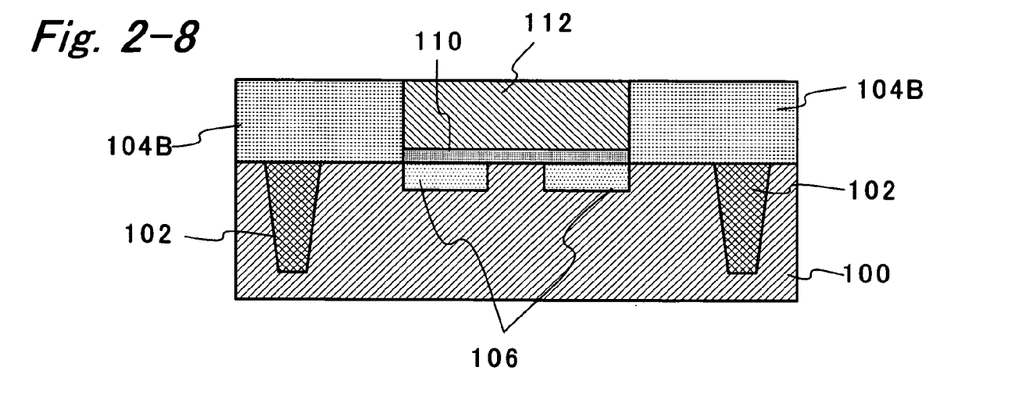

Subsequently, the poly-silicon layer 112 is polished by a well-known CMP process so that the poly-silicon layer 112 has the same height as the oxide layer pattern 104B, as shown in FIG. 2-8.

Figure 29:
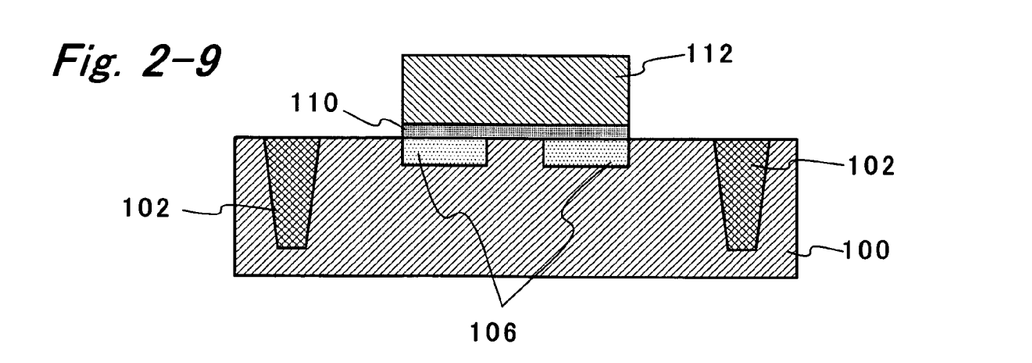

Next, the oxide layer pattern 104B is removed by a well-know conventional etching process to shape the gate electrode 112, as shown in FIG. 2-9. According to this preferred embodiment, the gate electrode 112 is formed using the oxide layer pattern 104B, which has been used for forming the low-density n-type impurity diffused regions 106; therefore, outer ends of the low-density n-type impurity diffused regions 106 and outer ends of the gate electrode 112 are well aligned to each other at a high accuracy.

Figure 210:
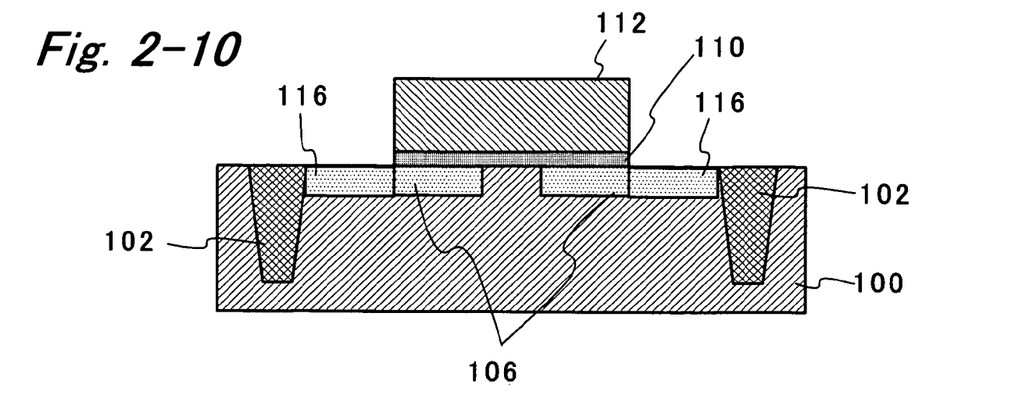

Next, as shown in FIG. 2-10, about $1.0 \times 10^{13}$ cm$^{-2}$ of impurities, such as phosphorus, are implanted in a surface of the silicon substrate 110 by a conventional photolithography process and an ion implantation process to form a pair of second low-density n-type impurity diffused regions 116. The second low-density n-type impurity diffused regions 116 are formed to be located outside (surrounding) the first low-density n-type impurity diffused regions 106 so that the first and second low-density n-type impurity diffused regions 106 and 116 are connected to each other.

Figure 211:
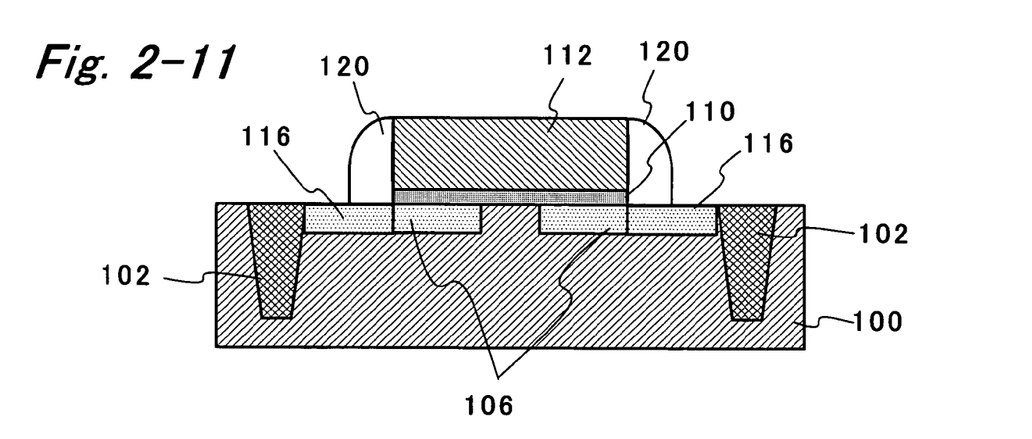

Next, an oxide layer is formed on the p-type silicon substrate 100 to have a thickness about 5000 Å by a conventional CVD process. Subsequently, an etching-back process is carried out to the oxide layer to form a side wall 120 on side surfaces of the gate electrode 112 and the gate insulation layer 110, as shown in FIG. 2-11.

Figure 212:
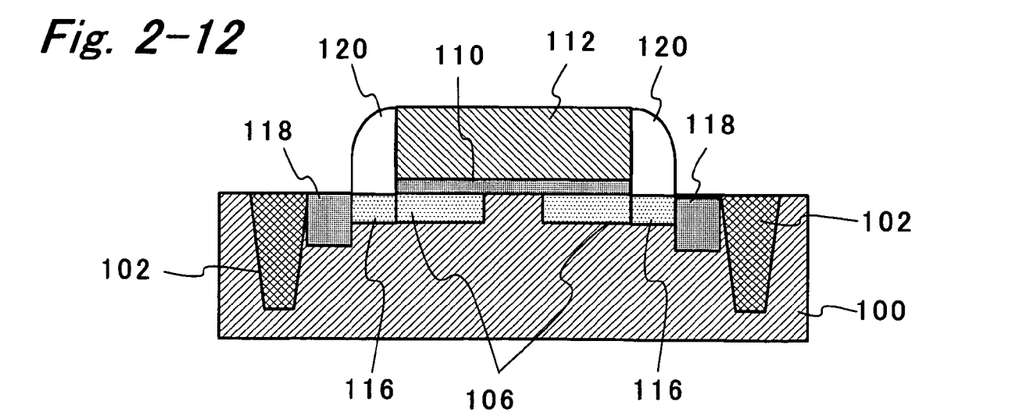

Next, impurity such as arsenic of about $5.0 \times 10^{15}$ cm$^{-2}$ is implanted into the surface of the silicon substrate 100 by a photolithographic process and an ion implantation process to form high-density n-type impurity-implanted regions 118, as shown in FIG. 2-12. The high-density n-type impurity-implanted regions 118 extend from the second low-density n-type impurity diffused regions 116 outwardly so that outer edges of the high-density n-type impurity-implanted regions 118 are located adjacent inner edges of the device isolating regions 102. After that, a thermal treatment is carried out to diffuse impurities in the first and second low-density n-type impurity diffused regions 106 and 116 and in the high-density n-type impurity-implanted regions 118.

The above described embodiment never limits or restricts the scope of the present invention. Although the above-described embodiment is applied to a high voltage NMOS transistor, the present invention is applicable to a high voltage PMOS transistor by changing conductive types of implanted ions.

What is claimed is:

1. A method for fabricating a high voltage semiconductor device, which comprises a semiconductor substrate; a gate insulation layer formed on the semiconductor substrate; and a gate electrode formed on the gate insulation layer, comprising:

forming a mask pattern on the semiconductor substrate;

forming a first low-density impurity implanted region on the semiconductor substrate using the mask pattern, in which the first low-density impurity implanted region is overlapped with the gate electrode;

selectively removing a part of the mask pattern from a region where the gate electrode is to be formed to form a gate-formation mask;

forming the gate insulating layer and the gate electrode using the gate formation mask;

removing the gate-formation mask after the gate electrode is formed; and forming a second low-density impurity implanted region on the semiconductor substrate so that the second low-density impurity implanted region is located outside the first low-density impurity implanted region.

2. A method for fabricating a high voltage semiconductor device according to claim 1, wherein the mask pattern and the gate-formation mask are made of an oxide layer.

3. A method for fabricating a high voltage semiconductor device according to claim 1, wherein the first low-density impurity implanted region is formed by implanting phosphorus.

4. A method for fabricating a high voltage semiconductor device according to claim 3, forming a high-density impurity implanted region after the second low-density impurity-implanted region is formed, the high-density impurity implanted region having a higher density of impurity than the first and second low-density impurity-implanted regions.

5. A method for fabricating a high voltage semiconductor device according to claim 1, further comprising:

forming a side wall on side surfaces of the gate electrode and the gate insulating layer.

6. A method for fabricating a high voltage semiconductor device according to claim 1, wherein the step of forming the gate electrode comprises: filling a gate electrode material in a cavity of the gate-formation mask; and polishing an upper portion of the gate electrode material.

7. A method for fabricating a high voltage MOS transistor, which comprises a semiconductor substrate; a gate insulation layer formed on the semiconductor substrate; and a gate electrode formed on the gate insulation layer, comprising:

forming a mask pattern on the semiconductor substrate;

forming a first low-density impurity implanted region on the semiconductor substrate using the mask pattern, in which the first low-density impurity implanted region is overlapped with the gate electrode;

selectively removing a part of the mask pattern from a region where the gate electrode is to be formed to form a gate-formation mask;

forming the gate insulating layer and the gate electrode using the gate-formation mask;

removing the gate-formation mask after the gate electrode is formed;

forming a second low-density impurity implanted region on the semiconductor substrate so that the second low-density impurity implanted region is located outside the first low-density impurity implanted region; and forming a high-density impurity implanted region after the second low-density impurity-implanted region is formed, the high-density impurity implanted region having a higher density of impurity than the first and second low-density impurity-implanted regions.

8. A method for fabricating a high voltage MOS transistor according to claim 7, wherein the first and second low-density impurity implanted regions are formed by implanting phosphorus.

9. A method for fabricating a high voltage MOS transistor according to claim 7, further comprising:

forming a side wall on side surfaces of the gate electrode and the gate insulating layer.

10. A method for fabricating a high voltage MOS transistor according to claim 7, wherein the mask pattern and the gate-formation mask is made of an oxide layer.

11. A method for fabricating a high voltage MOS transistor according to claim 7, wherein the step of forming the gate electrode comprises: filling a gate electrode material in a cavity of the gate-formation mask; and polishing an upper portion of the gate electrode material.

* * * * *